United States Patent [19]

Setoyama et al.

[11] Patent Number: 4,673,482
[45] Date of Patent: Jun. 16, 1987

[54] SPUTTERING APPARATUS

[75] Inventors: Eiji Setoyama; Keiji Arimatsu; Youichi Ohshita, all of Hitachi, Japan

[73] Assignee: Hitachi, Ltd., Tokyo, Japan

[21] Appl. No.: 911,421

[22] Filed: Sep. 25, 1986

[30] Foreign Application Priority Data

Sep. 26, 1985 [JP] Japan ................................ 60-212976

[51] Int. Cl.[4] ............................................. C23C 14/00
[52] U.S. Cl. .................................. 204/298; 204/192.2
[58] Field of Search ............................. 204/298, 192.2

[56] References Cited

U.S. PATENT DOCUMENTS

| | | | |
|---|---|---|---|
| 4,361,472 | 11/1982 | Morrison | 204/298 |
| 4,401,546 | 8/1983 | Nakamura et al. | 204/298 |
| 4,422,896 | 12/1983 | Class et al. | 204/298 |
| 4,434,038 | 2/1984 | Morrison | 204/298 |
| 4,448,653 | 5/1984 | Wegmann | 204/298 |
| 4,461,688 | 7/1984 | Morrison | 204/298 |
| 4,601,806 | 3/1986 | Wirz | 204/298 |
| 4,606,802 | 8/1986 | Kobayashi | 204/298 |

OTHER PUBLICATIONS

Meckel et al, Research Disclosure, Oct. 1979, pp. 537–540.
Kirov et al, Vacuum, 28 (1978) pp. 183–186.

Primary Examiner—Arthur P. Demers
Attorney, Agent, or Firm—Antonelli, Terry & Wands

[57] ABSTRACT

A sputtering apparatus for sputtering magnetic materials. The apparatus comprises at least one pair of magnetic field-generating sources, a substrate disposed within the magnetic field-generating sources, a target disposed opposite to the substrate, and a magnetic thin plate disposed at a side of the substrate which is remote from the target. The magnetic thin plate is disposed at a position in close contact with the substrate or a position slightly away from the substrate, or is disposed movably between such positions. When sputtering a magnetic material onto the substrate, a uniform magnetic field can be generated on the substrate surface by virtue of the provision of the thin magnetic plate.

7 Claims, 8 Drawing Figures

SPUTTERING APPARATUS

BACKGROUND OF THE INVENTION

1. Field of the Invention

The present invention relates to sputtering apparatus and more specifically to a structure of the sputtering chamber for production of thin films of magnetic materials suitable for generating a uniform magnetic field on the substrate.

2. Description of the Prior Art

Sputtering apparatus have increasingly been used as means for forming thin films of various materials in various fields of industry. As to the sputtering method, various types have been proposed, including a dipole sputtering method in which a target electrode consisting of a film-forming bulk material and a substrate which acts as a base material on which a film is to be formed are disposed at opposite positions, and also a magnetron sputtering method in which plasma is confined by a magnetic field thus improving the film-forming efficiency to a significant degree.

On the other hand, as to the film to be formed, a number of types are known, including films of metal and dielectric materials. The present invention involves metal films, more specifically, films to be formed with magnetic materials.

When forming a film of a magnetic material by sputtering, in order to obtain a film with the required magnetic characteristics, sputtering of the material should be carried out during formation of the film by applying a parallel magnetic field, so that the magnetic domains in the film being formed can be oriented in the same direction. Since the arrangement of the magnetic domains is based upon the atomic arrangement of the atoms comprising the film material, it is desirable for the crystal structure in the formed film to be uniformly arranged over a wide range. To this end, the magnetic field which is applied in a parallel manner with respect to the surface of the substrate to be subjected to the sputtering should be uniform over as wide a range as possible. However, since uniformity of the parallel magnetic field cannot be obtained when the magnetic field strength is either too high or too low, it is difficult to align the orientations of the magnetic domains in the film being formed over the whole surface of the substrate. In view of the recent conditions in industry, however, the need to apply a more uniform magnetic field to a wider range of the substrate surface is great despite the above difficulty, since, in order to increase the production yield in the film-forming process, it is necessary to treat substrates of increased size or number.

To meet such recent requirements, manufacturers have been adopting their own individual methods. These methods basically correspond to a method which comprises generating a magnetic field by utilizing magnetic field coils or permanent magnets in the direction corresponding to the orientation with which the magnetic domains in the film should desirably be aligned, as is known, for example, from "KOHMITSUDO JIKI KIROKU GIJUTSU SHUSEI (Collection of High-Density Magnetic Recording Techniques)" (complied by Tatsuro Tsushima; published by Sogoh Gijutsu Center), FIGS. 1 and 2 (pages 167 and 197). In all the examples disclosed in this document, the density profile and the orientation of the spatial magnetic field to be generated are determined in accordance with the structure and arrangement of the magnetic field-generating source, i.e. the coils or the magnets.

FIG. 1 is a lateral cross-sectional view of an example of a conventional sputtering apparatus. Reference number 2 denotes a vacuum chamber, while reference number 24 denotes coils arranged on the lateral surfaces of the chamber 2. Within the vacuum chamber 2 are arranged a substrate heater 18, a substrate 10, a shutter 16, and a target 6, these being disposed one above the other in the mentioned order starting at the top as viewed in the Figure. The target 6 is supported by a cathods electrode 4 around which is provided an earth shield plate 22.

The substrate 10 is supported by a substrate holder 8 and magnetic plates 26 are arranged the both side of the holder 8 as shown in FIG. 1.

An example of the prior art adopts this pole plate 26 with the intention of obtaining uniform orientation and uniform density of the spatial magnetic field. However, even with this arrangement, the density profile and the orientation of the spatial magnetic field are determined in dependence on the magnetic field-generating source, i.e. the coils or the permanent magnets. Therefore, with or without the above arrangement of the prior art, it is still difficult to obtain uniform orientation and uniform strength of the magnetic field over the whole surface of the substrate.

As described above, one of the problems encountered by formation of a film of a magnetic material is the difficulty of generating a uniform magnetic field on the surface of the substrate to be formed with the film.

SUMMARY OF THE INVENTION

It is an object of the invention to provide a sputtering apparatus which is, when sputtering a magnetic material onto a substrate, capable of forming a film while aligning the orientation of the magnetic domains in the magnetic material of which the film is to consist by generating a parallel magnetic field which is uniform, to thereby attain a film having the required magnetic characteristics.

According to the present invention, the arrangement of the sputtering apparatus includes a magnetic plate disposed in a plane parallel to and adjacent to the surface of a substrate which is positioned opposite to a target, leakage flux occurring upon magnetic saturation of the magnetic plate being, in the vicinity of the plate, relative to the configuration of the magnetic plate and the magnetic flux density, to thereby generate a uniform parallel magnetic field on the surface of the substrate. That is, the present invention provides a sputtering apparatus comprising at least one pair of magnetic field-generating sources, a substrate disposed within the magnetic field-generating sources, and a target disposed opposite to the substrate, the apparatus further comprising a magnetic thin plate disposed at a position in close contact with or adjacent to the substrate, at a side of the substrate which is remote from the target.

Preferably, the magnetic thin plate may be disposed in a movable manner between a position slightly away from the substrate and a position in close contact with the substrate.

According to the present invention, when sputtering a magnetic material onto a substrate, an external magnetic field which is applied parallel to the substrate surface can be made uniform by virtue of the arrangement of the sputtering apparatus of the invention, thus making it possible to form a film of the magnetic material in which the magnetic domains have their orientations aligned to an improved extent.

BRIEF DESCRIPTION OF THE DRAWINGS

FIG. 2A is a view showing the B-H characteristics curve of the axis of easy magnetization of a permalloy as an example of a magnetic material, while

FIGS. 3A and 3C are views showing the principles employed in the apparatus in accordance with the invention as a means of explaining the effects of the same, wherein FIG. 3A shows a spatial magnetic field between a pair of coils, FIG. 3C shows a spatial magnetic field when a thin magnetic plate is inserted between the coils;

DESCRIPTION OF THE PREFERRED EMBODIMENTS

An embodiment of the invention will be described below with reference to the drawings.

Figure 2A:
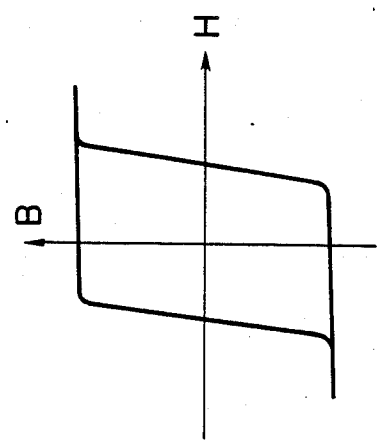
Figure 2B:
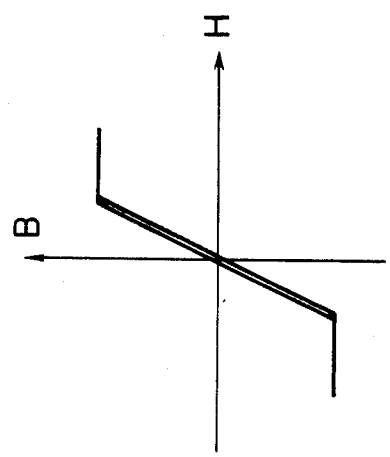
FIG. 2B is a view showing the B-H curve of the axis of hard magnetization of the permalloy.

Referring to FIGS. 2A and 2B which respectively show the B-H curves, of the axis of easy magnetization of a film made of permalloy (which is an example of a magnetic material), and the one of the axis of hard magnetization of the film. As shown in these Figures, when magnetic flux flows in the magnetic circuit in the direction of the axis of hard magnetization, the hysteresis loss caused by the reversal of magnetization can be made small. Separation of the axis of easy magnetization and the axis of hard magnetization, i.e. directing the direction of magnetization, can be obtained by applying a parallel magnetic field when forming a film, more specifically, the axis of easy magnetization is obtained in the direction of the application of the magnetic field, while the axis of hard magnetization is obtained in the direction perpendicular to the direction of the magnetic field application. Such directing of the direction of magnetization is essential for obtaining the required magnetic characteristics, and is usually carried out by applying an external magnetic field.

Figure 3A:
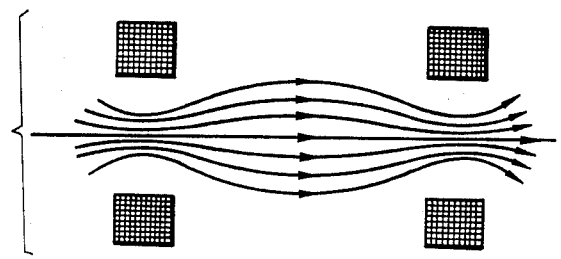

To apply an external magnetic field, a spatial magnetic field is induced, in the form shown in FIG. 3A, by transmitting current through a pair of coils, the current being transmitted in the same direction with respect to the coils.

In this case, however, the thus induced magnetic field is not uniformly parallel except at a limited part thereof at the center.

Figure 3B:
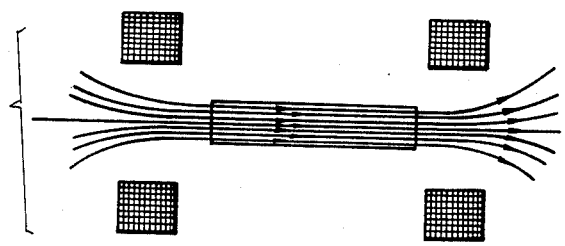
FIG. 3B shows a spatial magnetic field when a thick magnetic plate is inserted between the coils.

Next, when a thick magnetic material is inserted in the magnetic field as shown in FIG. 3B, most of the magnetic flux lines in the space between the coils are transmitted through the interior of the magnetic material, thus reducing substantially leakage flux outside the material. In this case, therefore, substantially spatial magnetic field in the vicinity of the magnetic material becomes to small.

Figure 3C:
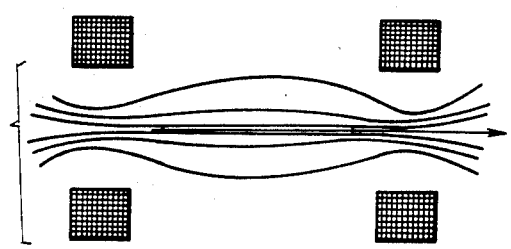

On the other hand, when a thin magnetic material is inserted instead of a thick magnetic material as shown in FIG. 3C, most of the magnetic flux lines in the space between the coils cannot be transmitted through the interior of the magnetic material because of the saturation of magnetic flux density occurring inside the thin magnetic material, and they thus form leakage flux and a spatial magnetic field in the space in the vicinity of the magnetic material. In this case, the spatial magnetic field is parallel with respect to the surface of the magnetic material and is uniform at its spatial portion close to the magnetic material.

The above spatial magnetic field formed by leakage flux from a flat plate of a magnetic material is employed in the sputtering apparatus of the invention.

Figure 1:
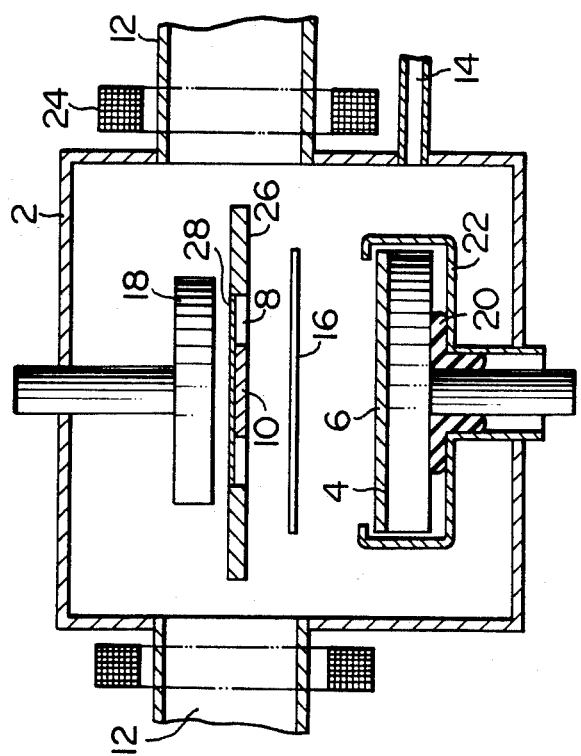
FIG. 1 is a lateral cross-sectional view of an embodiment of a sputtering apparatus in accordance with the invention.

Referring to FIG. 1 which shows an embodiment of the invention, a cathode electrode 4 for sputtering, a target material 6 also for sputtering, and a substrate 10 mounted on a substrate holder 8 are arranged within a vacuum chamber 2. The vacuum chamber 2 is subjected to evacuation by an evacuation device, not shown, through a discharge port 12, and is then supplied with a desired gas under control and through an inlet port 14, whereby its interior is filled with the gas and maintained at a predetermined gas pressure. The substrate holder 8 is disposed at a position directly above (as viewed in FIG. 1) of the target electrode 6 by a conveyor mechanism, not shown. Between the substrate holder 8 and the target electrode 6, a shutter plate 16 is arranged for controlling and minimizing the sputtering amount. At the rear (as viewed in FIG. 1) side of the holder 8, a substrate heater 18 is arranged for heating the substrate to a desired temperature. Reference number 20 denotes an insulating material, while reference number 22 denotes an earth shield plate.

The apparatus is provided with a pair of magnetic field-generating air-cored coils 24 which are disposed at opposite positions at the lateral sides of the substrate 10 for applying an external magnetic field to a plane coplanar with the surface of the substrate 10. The directions of the current transmitted through the pair of coils 24, i.e. those on the left and right as viewed in FIG. 1, are arranged to be the same; for instance, current transmitted through the left and right upper cross-sections of the coils is directed from the observe side of the plane coplanar with the surface of FIG. 1 toward the reverse side of the same plane. By thus arranging the direction of the current transmitted through the pair of coils 24, magnetic flux in the induced magnetic field is directed on the surface of the substrate 10 from the right hand side to the left hand side, as viewed in FIG. 1. Meanwhile, a magnetic plate 26 which is provided for improving the uniformity of the magnetic field on the surface of the substrate 10 is disposed parallel with respect to the substrate surface in such a manner as to be connected and secured to the substrate holder 8 or in such a manner that it constitutes a part of the holder 8, at both sides of the holder 8.

The feature of this embodiment is the provision of a yoke plate 28 in a parallel manner with respect to the substrate 10, the yoke plate 28 being made of a thin piece plate for magnetically connecting the portions of the magnetic plate 26 located at the sides of the thin plate.

Needless to say, connection between the yoke plate 28 and the magnetic plate 26 may be attained through the intermediary of a small gap.

Magnetic flux generated by the magnetic field-generating coils 24 is gathered onto the magnetic plate 26, and flows into the yoke plate 28 through the magnetic plate 26. If the yoke plate 28 is sufficiently thin, the magnetic flux density is saturated within the yoke plate 28, thereby generating a magnetic field of leakage flux which is parallel with respect to the yoke plate 28, as in the case shown in FIG. 3C. Since the thus generated magnetic field is more uniformly parallel as compared to a magnetic field generated by the arrangement with the magnetic plate 26 alone (without the yoke plate 28), the magnetic field on the substrate surface which is adjacent to the yoke plate 28 can be uniformly parallel.

Therefore, by sputtering a magnetic material onto the substrate 10 disposed within the magnetic field described above, it is made possible to form a film in which the magnetic domains have aligned orientation.

Although in this embodiment air-cored coils are disposed at opposite positions as a means of applying a magnetic field onto the substrate surface, this is not limitative, and the means may comprise another arrangement in which the magnetic plate 26 and the substrate holder 8 are arranged within a magnetic field generated in the gap between the magnetic poles of electromagnetic coils, or an arrangement in which permanent magnets are disposed at opposite positions.

Further, with regard to the substrate mounted on the substrate holder, a single substrate having a large diameter or a plurality of substrates may be mounted thereon.

Furthermore, as the sputtering source used in sputtering the magnetic material for the film to be formed, either the direct current type, the high frequency type, or the magnetron type may be used.

Figure 4:
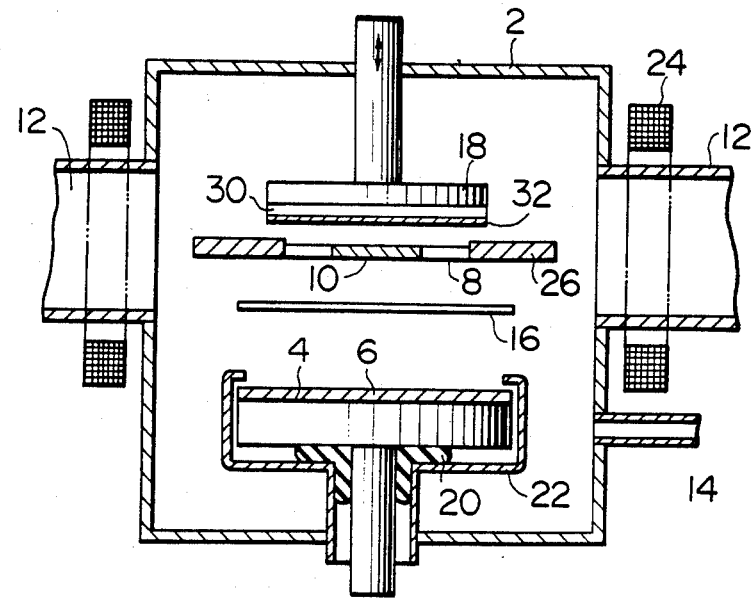
FIG. 4 is a lateral cross-sectional view of another embodiment of the sputtering apparatus in accordance with the invention.
Figure 5:
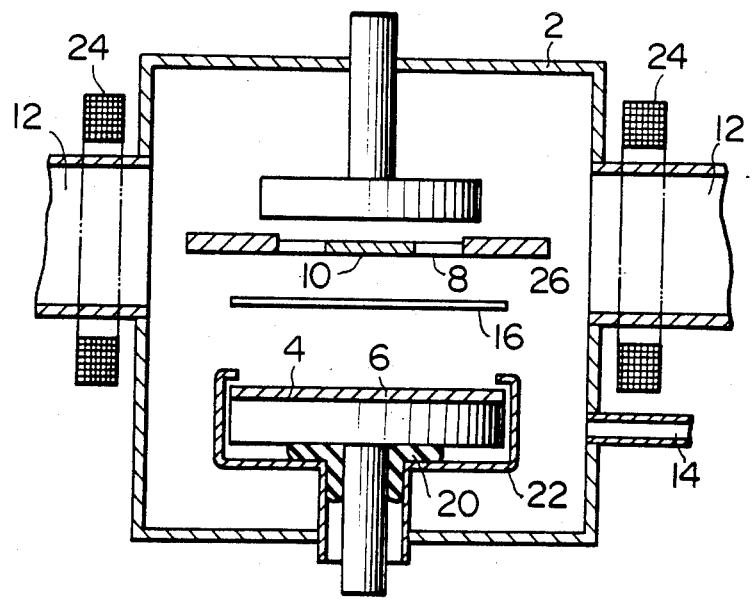
FIG. 5 is a lateral cross-sectional view of a conventional sputtering apparatus.

FIG. 4 shows another embodiment of the sputtering apparatus in accordance with the invention. In FIG. 4, the apparatus is provided with a heater 18 for heating the substrate, which is disposed at the rear side of the substrate 10, and with a uniformizing plate 30 for attaining uniform radiation of heat from the heater 18, this uniformizing plate 30 being arranged on the surface of the heater 18. The feature of this other embodiment of the invention is the provision of a yoke plate 32 made of a thin magnetic piece plate on the surface of the uniformizing plate 30. In the same manner as in the previous embodiment, the density of magnetic flux transmitted from the magnetic plate 26 is saturated, and a uniform parallel magnetic field is generated by leakage flux in a plane adjacent to the yoke plate 32. Further, according to this embodiment, the substrate heater 18 has an ascending-descending function, and when the heater 18 is operated so as to bring the yoke plate 32 into close contact with the substrate surface, the uniformity of the magnetic field, i.e. the distribution profile of the same, can be further improved.

We claim:

1. A sputtering apparatus comprising:
   at least one pair of magnetic field-generating sources;
   a substrate disposed within said magnetic field-generating sources;
   a target disposed opposite to said substrate; and
   a magnetic thin plate disposed at a side of said substrate which is remote from said target so that a uniform magnetic field is generated on the surface of said substrate.

2. A sputtering apparatus as claimed in claim 1, wherein said magnetic thin plate is disposed at a position in close contact with said substrate.

3. A sputtering apparatus as claimed in claim 1, wherein said magnetic thin plate is disposed at a position slightly away from said substrate.

4. A sputtering apparatus as claimed in claim 1, wherein said magnetic thin plate is disposed in a movable manner between a position slightly away from said substrate and a position in close contact with said substrate.

5. A sputtering apparatus as claimed in claim 1, wherein at least one additional substrate is disposed in a manner coplanar with said first substrate.

6. A sputtering apparatus as claimed in claim 1, further including a heater disposed at a side of said substrate which is remote from said target for heating said substrate, and a uniformizing plate arranged on the surface of said heater for making uniform the radiant heat from said heater, said magnetic thin plate being provided on the surface of said uniformizing plate.

7. A sputtering apparatus as claimed in claim 6, wherein said magnetic thin plate being constructed as a part of said uniformizing plate.

* * * * *